(12) United States Patent
Rodriguez

(10) Patent No.: US 6,392,476 B1
(45) Date of Patent: *May 21, 2002

(54) SYSTEM AND METHOD OF PRODUCING DIRECT AUDIO FROM A POWER SUPPLY

(75) Inventor: Manuel D. Rodriguez, Reseda, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/524,304

(22) Filed: Mar. 14, 2000

(51) Int. Cl.$^7$ ................................................ H03F 3/38
(52) U.S. Cl. ...................................... 330/10; 330/207 A
(58) Field of Search ............................... 330/10, 207 A, 330/251

(56) References Cited

U.S. PATENT DOCUMENTS

| | | | |
|---|---|---|---|
| 4,573,018 A | 2/1986 | Mirow | 330/10 |
| 4,703,500 A | 10/1987 | Pollard | 379/252 |
| 5,115,205 A | 5/1992 | Holmes, Jr. | 330/10 |
| 5,117,198 A | 5/1992 | Morenz | 330/10 |
| 5,225,789 A | * 7/1993 | Caine et al. | 330/10 |
| 5,610,553 A | * 3/1997 | Kim | 330/10 |
| 5,612,646 A | * 3/1997 | Berning | 330/10 |
| 5,986,498 A | 11/1999 | Rodriguez | 330/10 |

FOREIGN PATENT DOCUMENTS

| | | |
|---|---|---|
| EP | 0 386 933 A2 | 10/1989 |
| WO | WO 88/00774 | 7/1986 |
| WO | WO 98/24174 | 11/1996 |

OTHER PUBLICATIONS

HCG/HCM–EE Group, Audio Amplifiers: Circuits & Topologies, Jul. 9, 1998.

* cited by examiner

*Primary Examiner*—Tuan T. Lam
(74) *Attorney, Agent, or Firm*—Squire, Sanders & Dempsey L.L.P.

(57) ABSTRACT

A novel circuit that generates direct audio from a power supply that uses no power amplifier and that can provide full isolation to any impedance load. It has no power amplifier output stage and has a zero signal-to-noise ratio when there is no signal input because the circuit is designed with MOSFETS that do not conduct unless there is a signal input. The circuit includes an input rectifier for rectifying an input audio signal, a pulse width modulator for producing a signal modulated by the rectified audio signal, a power amplification stage for amplifying the pulse width modulated signal, a positive/negative rectifier pair for positively and negatively rectifying the amplified pulse width modulated signal, a demodulator for demodulating the positively and negatively rectified signal in order to generate a power amplified audio signal, and a switching network for directing the positively rectified signal to the demodulator in response to the signal polarity detector sensing a first polarity of the input audio signal, and for directing the negatively rectified signal to the demodulator in response to the signal polarity detector sensing a second polarity of the input audio signal. A low power embodiment uses a single power supply to bias push-pull transistors, a medium power embodiment uses positive and negative rails individually to bias the push-pull transistors, and a high power embodiment uses the additive sum of the positive and negative rails to bias the push-pull transistors.

38 Claims, 4 Drawing Sheets

SYSTEM AND METHOD OF PRODUCING DIRECT AUDIO FROM A POWER SUPPLY

CROSS REFERENCE TO RELATED PATENT

This application is related to U.S. Pat. No. 5,986,498 issued on Nov. 16, 1999, entitled "AUDIO DIRECT FROM POWER SUPPLY," which is incorporated herein by reference.

FIELD OF THE INVENTION

The present invention relates in general to audio amplifiers and in particular a method and apparatus for obtaining off-line direct audio from a power supply without the use of a relatively high-power amplifier circuit.

BACKGROUND OF THE INVENTION

Audio circuits are well known in the prior art and generally utilize an audio amplifying circuit to drive the audio speaker. The audio amplifier is required to a be power audio stage. Such power amplifier circuits are illustrated in U.S. Pat. Nos. 4,409,559 and 4,651,112.

A typical class AB audio amplifier has a power supply and the audio amplifier. The cost of these two units together is significant in the manufacture of an audio output device. There are many switching power amplifiers that attempt to avoid the requirement of an audio power amplifier in the circuit.

Such circuits are shown in U.S. Pat. Nos. 4,763,080, 4,517,522, 4,047,120, and 4,453,131.

Class D amplifiers are always switching at fifty percent duty cycle even when no signal is applied. This causes an inherent noise that increases the signal-to-noise ratio when no signal is applied.

It would be advantageous to have a highly efficient effective audio output circuit deriving its energy from a power supply and avoiding the requirement of having an expensive audio amplifier as the final stage.

SUMMARY OF THE INVENTION

The present invention relates to an off-line direct audio circuit utilizing the power supply and not requiring a power amplifier output stage. Because all power is delivered directly to the audio speaker from a switching transformer that provides a modulated signal obtaining variable voltages, there is no traditional audio stage like AB or Class D amplifiers.

In the present invention, the audio input signal is applied to an error amplifier with a traditional feedback circuit. The input signal is full-wave rectified after the error amplifier. A pulse-width modulator circuit modulates the signal from the full-wave rectifier and that signal is coupled to a high-powered switching circuit. The high-powered switching circuit comprises a gate-drive unit isolated from the pulse-width modulator with a transformer and an output switching power transformer that transforms modulated high voltage/low current on the input to a modulated low voltage/high current on the output. Because the audio signal has been pulse-width modulated, the signal polarity at the output of the switching power transformer must be determined. Therefore, a zero-crossing detector is utilized to determine the zero crossings of the input audio signal. Those signals are coupled to first and second switches that gate the proper signal polarity outputs of the switching power transformer. The outputs are then filtered with a low-pass filter to remove the modulation signal and generate the audio output signal having sufficient amplitude to drive the speaker. A phase-lag compensation from the feedback circuit is coupled to the input signal and the error amplifier to prevent oscillations of the circuit.

This circuit needs no power audio stage, is extremely efficient due to high voltage on the switching gates, and has a cost about one-half with respect to traditional Class AB power amplifier circuits. Further, when no audio signal is applied, there are no pulses from the pulse-width modulator and thus the signal-to-noise ratio is zero because there is no idle current that flows.

Thus, it is an object of the present invention to provide a direct audio output signal from a power supply.

It is another object of the present invention to pulse-width modulate an input audio signal and to use the pulse-width modulation to drive isolated gates that have a high voltage applied thereto and low current and then utilize an output transformer for switching the high voltage/low current pulse-modulated voltage to a low voltage/high current signal on the output of the transformer that can be properly detected with a switching circuit and then demodulated to provide the audio output signal for driving the speaker.

It is still another object of the present invention to use MOSFETS for the gates utilizing the high voltage and low current inasmuch as the MOSFET devices are more efficient because lower current represents lower losses due to the internal resistance of the MOSFETS.

Further, it is an object of the present invention to provide power MOSFETS that do not switch when there is no input audio signal thus having a zero signal-to-noise ratio when no signal is applied.

It is still another object of the present invention to provide a direct audio from the power supply using an off-line system wherein the power supply is connected to AC line or the AC mains.

Thus, the present invention relates to a method of obtaining off-line direct audio from the power supply comprising the steps of receiving an input audio signal, modulating a power supply voltage with the input audio signal, the power supply voltage being sufficient to drive an audio speaker, coupling the modulated power supply voltage to a filter circuit to recover the audio signal and driving the audio speaker with the recovered audio signal without further amplification.

The invention also relates to apparatus for obtaining off-line direct audio directly from a power supply comprising a terminal for receiving an audio input signal, a voltage source having sufficient voltage of first and second polarity to drive the audio output speaker, a modulator for modulating the voltage from the voltage source with the audio input signals on the terminal, and a filter circuit for recovering the audio signal and providing a driving voltage sufficient to cause the audio signals to be reproduced by the audio output speaker.

Yet, another embodiment of an audio amplifier drive circuit is disclosed that is particularly useful for low voltage applications. The audio amplifier comprises a full wave rectifier for rectifying an input audio signal, a pulse with modulator for producing a signal modulated by the input audio signal, a power amplification stage comprising a pair of transistors in a push-pull configuration, and a voltage step-up switching transformer having an input winding for receiving a power amplified pulse modulated signal generated by the switching transistors. The input winding of the switching transformer has an intermediate tap for receiving a low power supply voltage to bias the switching transistors connected respectively to opposite ends of the input winding.

The audio amplifier drive circuit further includes positive and negative rectifiers connected to an output winding of the switching transformer for positively and negatively rectifying the power amplified pulse width modulated signal, a demodulator for demodulating the positively and negatively rectified pulse width modulated signals, and a switching network for directing the positively rectified pulse width modulated signal to the demodulator in response to a signal polarity detector sensing a positive polarity signal of the input audio signal, and for directing the negatively rectified pulse width modulated signal to the demodulator in response to the signal polarity detector sensing a negative polarity of the input audio signal.

Still, another embodiment of an audio amplifier drive circuit is disclosed that is particularly useful for high power amplification applications, and for driving multiple speakers. This audio amplifier comprises a full wave rectifier for rectifying an input audio signal, a pulse width modulator for producing a pulse width modulated signal from the rectified audio signal, a power amplification stage comprising two pairs of push-pull transistors for respectively producing positive and negative currents through an input winding of a switching transformer. The higher power is achieved by each pair of transistors simultaneously applying the positive and negative rails of a power supply at the input winding of the switching transformer to produce higher currents.

The high power audio drive circuit further includes two positive/negative rectifier pairs connected to the output winding of the switching transistor. One pair of positive/negative rectifier is used to drive a first speaker, another pair drives a second speaker, and both pairs also is used to drive a third speaker connected to the other two speakers in a bridge made configuration. One of the positive/negative pairs is coupled to a switching network that directs a positively rectified pulse width modulated signal to a demodulator in response to a signal polarity detector sensing a positive polarity of the input audio signal, and directs a negatively rectified pulse width modulated signal to the demodulator in response to the signal polarity detector sensing a negative polarity of the input audio detector. The other positive/negative rectifier pair is coupled to a switching network that directs a positively rectified pulse modulated signal to a second demodulator in response to the signal polarity sending a negative polarity of the input audio signal and directs a negatively rectified pulse width modulated signal to the second demodulator in response to the signal polarity detector sensing a positive polarity of the input audio signal.

BRIEF DESCRIPTION OF THE DRAWINGS

These and other features of the present invention will be more fully disclosed when taken in conjunction with the following Detailed Description of the Preferred Embodiment(s) in which like numerals represent like elements and in which.

DETAILED DESCRIPTION OF THE INVENTION

Figures 1, 2:
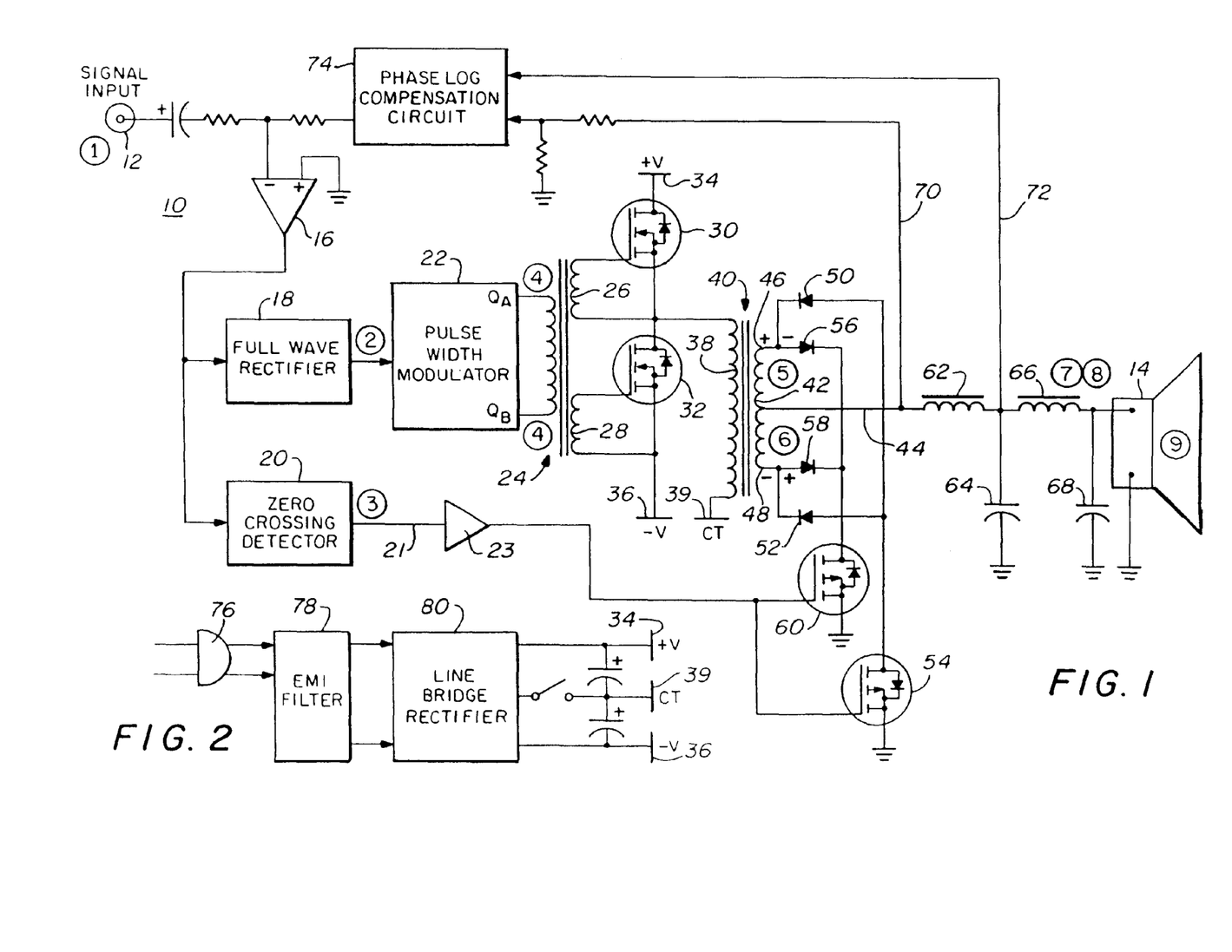
FIG. 1 is a block diagram of the novel audio circuit.
FIG. 2 is a block diagram of the power supply forming a part of the novel circuit of FIG. 1.
Figure 3:
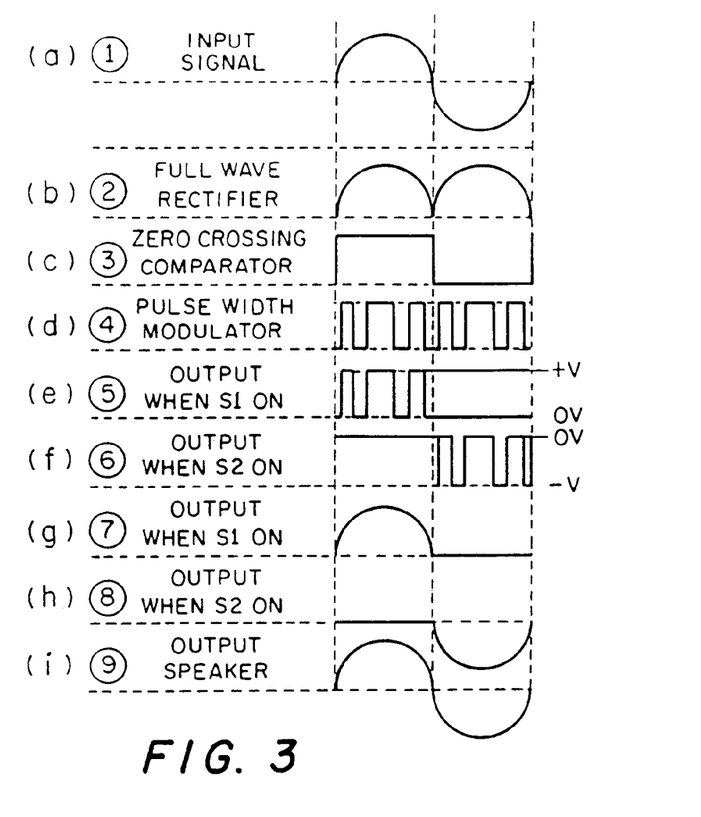
FIG. 3 is a waveform diagram illustrating the various waveforms at particular points in the circuit of FIG. 1.

FIG. 1 illustrates the novel audio drive circuit 10 in block diagram form. The audio input signal at terminal 12 (FIG. 3a) is coupled through the novel circuit 10 to drive the audio speaker 14 (FIG. 3i). The signal passes through an error amplifier 16 into a full-wave rectifier 18 and a zero-crossing detector 20. From the full-wave rectifier the input signal shown in FIG. 3(a) is rectified to that waveform shown in FIG. 3(b). The signal from the full-wave rectifier 18 is coupled to a pulse-width modulator 22 that generates the output shown in FIG. 3(d) to the input winding of transformer 24.

Transformer 24 serves to isolate the power MOSFET gates 30 and 32 from the pulse-width modulator circuit 22. The positive and negative voltages from the power supply (shown in FIG. 2) on terminals 34 and 36 are coupled to terminals 34 and 36 shown in FIG. 1 as an input to the MOSFETS 30 and 32. The MOSFETS 30 and 32 are triggered by the pulse-width-modulated signals from modulator 22 through transformer windings 26 and 28. Because there is a high voltage coupled to the power terminals 34, 36 of the MOSFETS, there is a high voltage and low current through the MOSFETS. This is advantageous since the MOSFETS are used as high-frequency switches and the internal resistance when they are conducting can be analoged to the contact resistance of any switch. Since the power losses are dependent of the RMS current passing through the MOSFETS and the internal ON resistance, the losses caused by the MOSFET internal resistance in the ON state are minimal because of the low current. Since the positive 160 volts is coupled to the MOSFET 30 and negative 160 volts is connected to the MOSFET 32, MOSFET 30 gates the positive-going pulse-width modulated signals to the input winding 38 of switching power transformer 40. In like manner, MOSFET 32 switches the negative-going pulse-width modulated pulses to the input winding 38 of switching power transformer 40. Thus the gates 30 and 32 are alternately switched ON by the first and second polarity pulse-width modulated signals.

Power transformer 40 transfers the energy to the filter demodulator formed by inductors 62 and 66 and capacitors 64 and 68.

Since there are positive and negative-going pulse-width modulated signals being applied to transformer 40, the output must be gated so that at the proper time the positive pulses are transferred to the filter demodulator and at the proper time the negative pulses are transferred to the filter demodulator. In order to do that, the zero-crossing detector 20 produces signals on line 21 that are coupled through buffer 23 to switches 54 and 60. These zero-crossing detector signals gate either switch 54 or switch 60 to enable the proper signals to be taken off the center tap 44 of secondary winding 42 of the power transformer 40. See the wave shapes 3(e) and 3(f).

The filter demodulator comprises inductors 62 and 66 and capacitors 64 and 68. When switch 60 is conducting, the positive pulses are demodulated and shown as the signal in FIG. 3(g). When switch 54 is ON, the negative pulses are demodulated and are shown as the signal in FIG. 3(h). The composite signal that is applied to the speaker 14 is shown in FIG. 3(i).

FIG. 2 illustrates in block diagram the power supply that is coupled to the MOSFETS 30 and 32 and transformer winding 38 of the switching power transformer 40. The line voltage at 76 is coupled to an electromagnetic interference filter 78 and then to a line bridge rectifier 80. The outputs produced are +160 volts on terminal 34, −160 volts on terminal 36, and the center tap at terminal 39.

Figure 4:
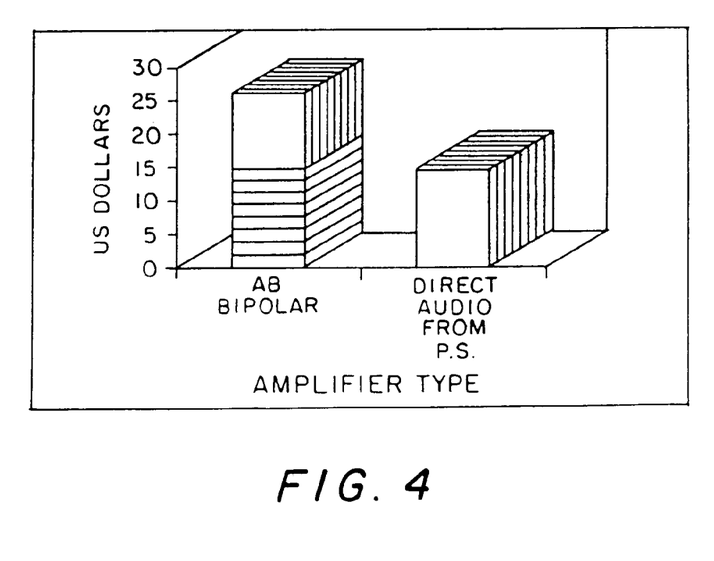
FIG. 4 is a graph illustrating the cost of a typical prior art 100-watt AB audio amplifier as compared with the cost of the present circuit where direct audio is obtained directly from the power supply.

There are several advantages to the novel off-line direct audio from power supply circuit. First, no power audio stage is needed. Further, a better efficiency is obtained due to the high voltage on the AC power line 76. Third, the cost of the completed audio speaker driver circuit is about one-half the traditional Class AB amplifier circuit. Note, in FIG. 4, that the cost for 100-watt audio amplifier for an AB bipolar system is approximately $26. About $14 of that is for the amplifier and approximately $12 is for the power supply. Note that the novel circuit for obtaining direct audio from the power supply costs approximately $14. Thus, there is a great advantage to utilizing the present circuit to generate the audio signals for driving the audio speaker. Further, when there is no audio signal applied, there is no output from the pulse-width modulator 22 and thus the MOSFETS 30 and 32 are not conducting. Therefore the signal-to-noise ratio is zero because there is no current flowing through the MOSFETS 30 and 32 when there is no signal input. This is not the case in the traditional amplifiers when there is noise generated by the amplifiers even though no signal is applied because they are still conducting without a signal input.

Thus, there has been disclosed a novel circuit for a power supply that is connected directly to the AC line or AC main and that generates direct audio from the power supply to drive an audio speaker. pill power is delivered directly from a switching transformer where the modulated audio signal is recovered to provide an output that drives the speaker after being demodulated. There is no traditional audio stage such as in conventional Class AB or Class D audio amplifiers. Further, by utilizing an isolating transformer and a switching power transformer, the current through MOSFETS is lower and is determined by the turns ratio of the switching transformer. MOSFET devices are more efficient because lower current represents lower losses due to the ON resistance of the devices. Thus, where high voltages are involved, there are low currents and the switching power transformer because of its turns ratio generates an output that has lower voltage and higher current. Finally, because the power MOSFETS conduct only when there is a signal input, the signal-to-noise ratio is zero when there is no signal because there is no current passing through the MOSFETS and, thus, no output current.

Figure 5:
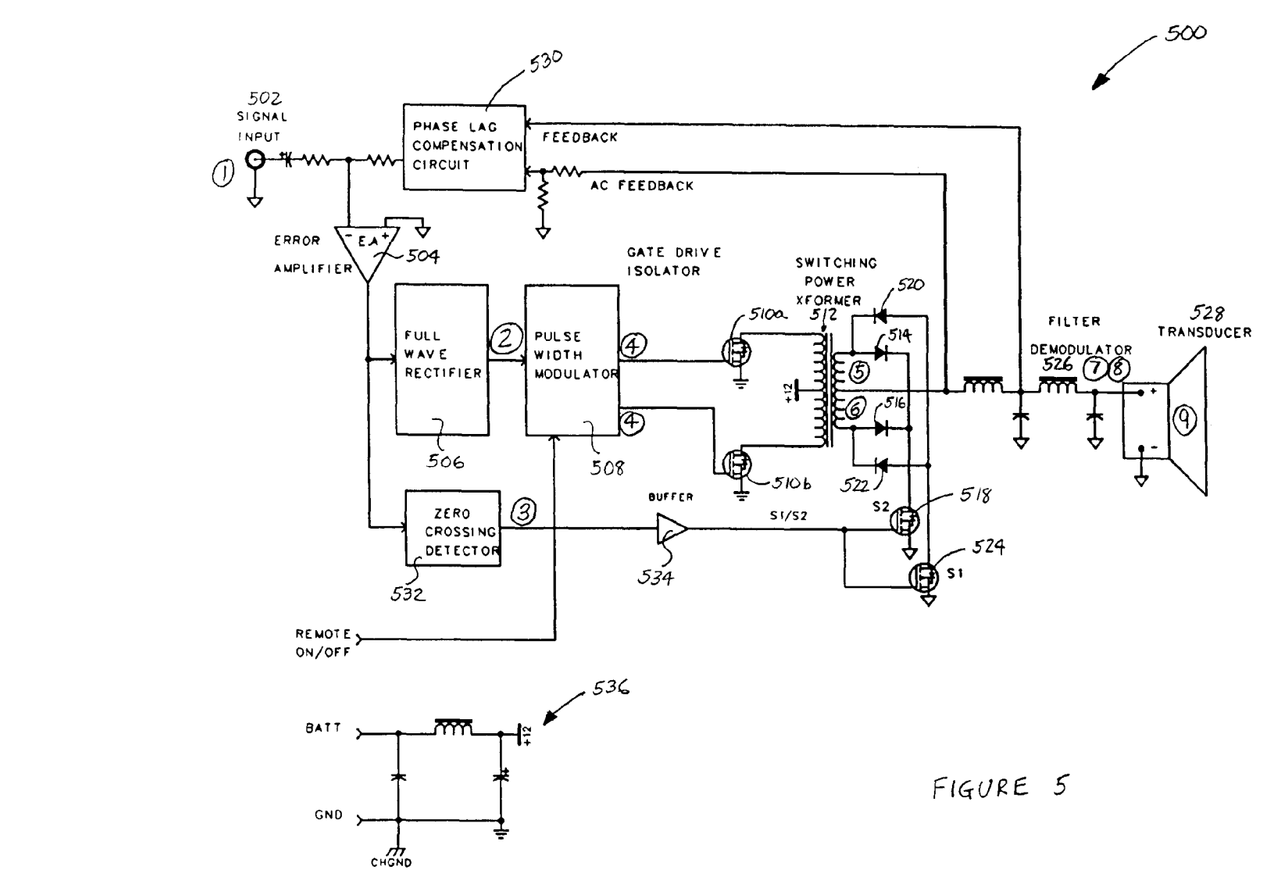
FIG. 5 illustrates a block/schematic diagram of another audio amplifier in accordance with the invention.

FIG. 5 illustrates a block/schematic diagram of another exemplary audio amplifier 500 in accordance with the invention. Audio amplifier 500 is particularly useful for low power supply voltage applications, such as in vehicle radio applications where typically a 12 Volt battery is used. The audio amplifier 500 is similar to the exemplary audio amplifier 10 depicted in FIG. 1, and comprises an input terminal 502, an error amplifier 504, a full wave rectifier 506, a pulse width modulator 508, a power amplification stage comprising a pair of switching field effect transistors (FETs) 510*a–b* in a push-pull configuration, a switching power transformer 512, positive voltage rectifier comprising diodes 514 and 516 with corresponding gate 518, negative voltage rectifier comprising diodes 520 and 522 with corresponding gate 524, and filter/demodulator 526 which is to be coupled to a loudspeaker 528. Additionally, the audio amplifier 500 further includes a phase lag compensation circuit 530, a zero crossing detector 532, a buffer 534, and a power supply 536.

The audio amplifier 500 differs in several respects to the exemplary amplifier 10 depicted in FIG. 1. First, the power supply voltage 536 for the switching transistors 510*a–b* is applied through an intermediate tap of the primary winding of the switching power transformer 512 to the drain terminals of transistors 510*a–b*. Second, the source terminals of the transistors 510*a–b* are grounded, which thereby eliminates the use of a negative voltage to operate the switching transistors 510*a–b*. This feature of the audio amplifier 500 is particularly useful when a single polarity voltage power supply is used, such as a vehicle battery. Third, the switching transformer 512 is preferably a step-up transformer to increase the low voltage (e.g. 12 Volts) present in the primary winding to a larger voltage sufficient to drive the loudspeaker 528 at the desired power level. Fourth, there is an absence of an isolating transformer for isolating the pulse width modulator 508 from the switching transistors 510*a–b*.

Figure 6:
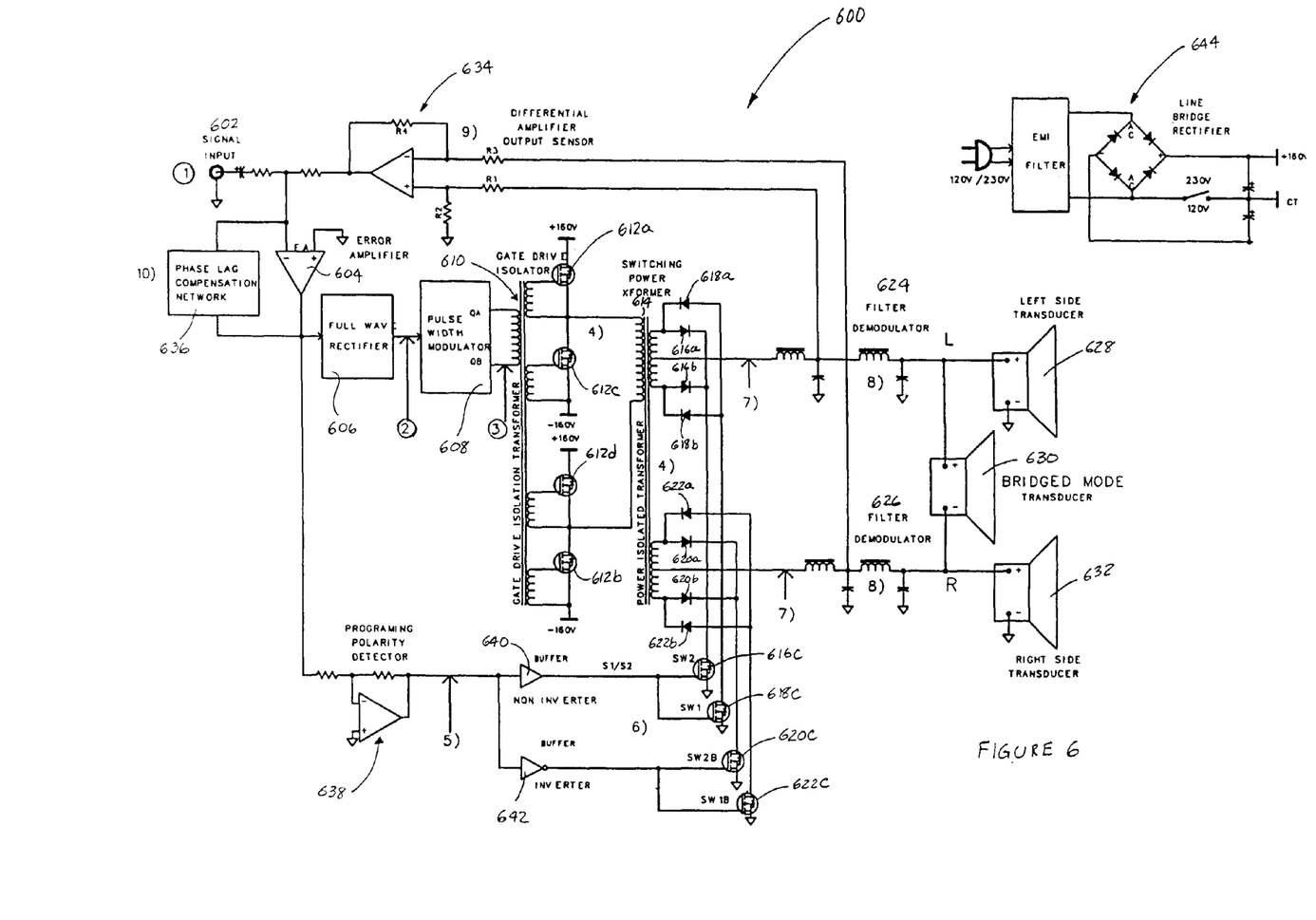
FIG. 6 illustrates a block/schematic diagram of yet another audio amplifier in accordance with the invention.

FIG. 6 illustrates a block/schematic diagram of yet another exemplary audio amplifier 600 in accordance with the invention. Audio amplifier 600 is particularly useful for high power applications, such as for driving concert/arena type loudspeakers. Additionally, the audio amplifier 600 is particularly suited for driving multiple loudspeakers, such as when it is driving left, right and bridge mode loudspeakers.

The audio amplifier 600 is similar to the exemplary audio amplifier 10 depicted in FIG. 1, and comprises an input terminal 602, an error amplifier 604, a full wave rectifier 606, a pulse width modulator 608, an isolation transformer 610, a power amplification stage comprising first and second pairs of push-pull switching field effect transistors (FETs) 612*a–b* and 612*c–d*, a switching power transformer 614, a first positive voltage rectifier comprising diodes 616*a* and 616*b* with corresponding gate 616*c*, a first negative voltage rectifier comprising diodes 618*a* and 618*b* with corresponding gate 618*c*, a second positive voltage rectifier comprising diodes 620*a* and 620*b* with corresponding gate 620*c*, a second negative voltage rectifier comprising diodes 622*a* and 622*b* with corresponding gate 622*c*, a first filter/demodulator 624 which is to be coupled to positive terminals of loudspeaker 628 and 630, and a second filter/demodulator 626 which is to be coupled to a negative terminal of loudspeaker 630 and a positive terminal of loudspeaker 632.

Additionally, the audio amplifier 600 includes a differential amplifier 634 for measuring the voltage differences at the respective inputs of the left and right loudspeakers in combination with a phase lag compensation network 636 connected in feedback across the error amplifier 604 in order to provide the audio amplifier 600 stability and prevent unwanted oscillations. Also, the audio amplifier 600 further includes a signal polarity detector 638 which drives gates 616*c* and 618*c* by way of buffer 640 and gates 620*c* and 622*c* by way of inverter buffer 642. The audio amplifier 600 also includes a power supply 644 for generating the positive and negative voltages (e.g. +/−160 Volts) for operating the two pairs of switching transistors 612*a–b* and 612*c–d*.

The audio amplifier 600 differs in several respects from the exemplary amplifier 10 depicted in FIG. 1. First, the isolation transformer 608 includes four output windings connected respectively to the gates of switching transistors 612*a–d*. Transistors 612*a* and 612*d* are p-channel FETs and turn on when the pulse modulated signal is above a positive threshold. Transistors 612*b* and 612*c* are n-channel FETs and turn on when the pulse modulated signal is below the positive threshold. Accordingly, the voltage difference across the primary of the switching transformer 614 is the additive sum of the power supply positive and negative rails, which in this case, for example, it is 320 Volts. Because of the large voltage swing across the primary winding of switching transformer 614, potentially greater power amplification can be provided with audio amplifier 600.

The audio amplifier 600 also differs from the exemplary amplifier 10 in that it includes two positive/negative full rectifiers pairs 616/618 and 620/622 connected to respective output windings of the switching transformer 614. The positive/negative rectifier pair 616/618 with corresponding gates 616c and 618c provide the positive and negative rectification of the pulse modulated signal based on the input signal polarity for driving the left side loudspeaker 628. The positive/negative rectifier pair 620/622 with corresponding gates 620c and 622c provide the positive and negative rectification of the pulse modulated signal based on the input signal polarity for driving the right side loudspeaker 632. Because buffer 642 is inverted and buffer 642 is not, the rectified signal at the output of the left positive/negative rectifier pair 616/618 is around 180 degrees out-of-phase with the rectified signal at the output of the right positive/negative rectifier pair 620/622. Both these rectified signals drive the bridge mode loudspeaker 630.

Additionally, the audio amplifier 600 differs from the exemplary amplifier 10 in that the phase lag compensation network 636 provides the stability based on the voltage differences of the left and right speakers driving signals, which is generated by differential amplifier 634. The phase lag compensation network 636 is configured as a feedback for the error amplifier 604, instead of being at the input of the amplifier as provided in amplifier 10.

The corresponding structures, materials, acts, and equivalents of all means or step plus function elements in the claims below are intended to include any structure, material, or act for performing the function in combination with other claimed elements as specifically claimed.

What is claimed is:

1. A method of obtaining off-line direct audio from a power supply comprising the steps of:
   receiving an input audio signal;
   modulating said input audio signal;
   coupling said modulated input audio signal to an input winding of an isolating transformer having first and second output windings;
   detecting polarity of the input audio signal;
   positively rectifying the audio signal from the first output winding when the detecting polarity of the input audio signal is positive;
   negatively rectifying the audio signal from the second output winding when the detecting polarity of the input audio signal is negative; and
   filtering both the positively and negatively rectifying audio signals to drive an audio speaker.

2. The method of claim 1 further comprising:
   coupling the output of each one of said first second output windings to the input winding of a power transformer;
   coupling a first switch to an output winding of said power transformer for passing pulse-width modulated signals of a first polarity;
   coupling a second oppositely polled switch to the output winding of said power transformer for passing pulse-width modulated signals of a second polarity; and
   coupling an input audio signal zero crossing detector to said first and second switches to cause said switches to altenately conduct and transfer all power directly from said power transformer to said filter circuit for driving said audio speaker.

3. The method of claim 1 further including the step of switching on the positively rectifying audio signal and switching off the negatively rectifying audio signal when the detecting polarity of the input audio signal is positive.

4. The method of claim 1 further including the step of switching off the positively rectifying audio signal and switching on the negatively rectifying audio signal when the detecting polarity of the input audio signal is negative.

5. the method of claim 1 wherein the input audio signal is 12-volt input signal.

6. A method of obtaining off-line direct audio from a power supply comprising the steps of:
   receiving an input audio signal;
   full-wave rectifying said input audio signal;
   converting said full-wave rectified input audio signal into a pulse-width modulated audio signal to produce a higher power pulse-width modulated audio signal;
   detecting a zero crossing of said input audio signal and generating a corresponding signal;
   coupling said higher power pulse-width modulated audio signal to the input winding of a switching power transformer;
   gating said higher power pulse width modulated audio signal from an output winding of said switching power transformer with said corresponding signal, wherein when the corresponding signal from the zero crossing is positive, then said gating positively rectifying to provide a positive higher power pulse-width modulated signal to a first filter circuit having sufficient voltage sufficient voltage amplitude to drive an audio speaker, wherin when the corresponding signal from zero crossing is negative, then said gating negatively rectifying to provide a negative high power pulse-width modulated signal to the first filter circuit having suffient voltage amplitude to drive said audio speaker.

7. The method of claim 6, wherein the step of gating further comprises the steps of:
   a first switch coupled to the output winding of said switching power transformer for gating said higher pulse-width modulated audio signal of a first polarity to said first filter circuit when activated by said corresponding signal; and
   a second switch coupled to the output winding of said switching power transformer for gating said higher pulse-width modulated audio signal of the opposite polarity to the first filter circuit when activated by said corresponding signal.

8. The method of claim 6, wherein the step of coupling said higher power pules-width modulated audio signal to the input winding of said switching power transformer further includes:
   coupling said pulse-width modulated audio signal to a pair of push-pull transistors for generating cycling current in the input winding of said switching power transformer based on said pulse-width modulated signal.

9. The method of claim 8, wherein the step of gating further comprising the steps of:
   a first switch coupled to the output winding of said switching power transformer for gating said higher power pulse-width modulated audio signal of a first polarity to said filter circuit when activated by said corresponding signal; and
   a second switch coupled to the output winding of said switching power transformer for gating said higher power pulse-width modulated audio signal of the opposite polarity to the filter circuit when activated by said corresponding signal.

10. The method of claim 6, wherein the step of coupling said higher power pulse-width modulated audio signal to the input winding of said switching power transformer further includes:

coupling said pulse-width modulated audio signal to a first pair of push-pull transistors to cause the power supply to generate a positive polarity current in the input winding of said switching power transformer based on said pulse-width modulated audio signal; and coupling said pulse-width modulated audio signal to a second pair of push-pull transistors to cause the power supply to generate a negative polarity current in the input winding of said switching power transformer based on said pulse-width modulated audio signal; and coupling said pulse-width modulated audio signal to a second pair of push-pull transistors to cause the power supply to generate a negative polarity current in the input winding of said switching power transformer based on said pulse-width modulated audio signal.

11. The method of claim 10, wherein the step of gating the audio output of the switching power transformer comprises the steps of:

a first switch coupled to the output winding of said switching power transformer for gating said higher power pulse-width modulated audio signal of a first polarity to said first filter circuit when activated by said corresponding signal;

a second switch coupled to the output winding of said switching power transformer for gating said higher power pulse-width modulated audio signal of the opposite polarity to the first filter circuit when activated by said corresponding signal;

a third switch coupled to the output winding of said switching power transformer for gating said higher power pulse-width modulated audio signal of the first polarity to a second filter circuit when activated by said corresponding signal, wherein said second filter circuit is used to drive at least a second speaker; and a fourth switch coupled to the output winding of said switching power transformer for gating said higher power pulse-width modulated audio signal of the opposite polarity to the second filter circuit when activated by said corresponding signal.

12. The method of claim 11, further including the step of applying said audio signals filtered by said first and second filter circuits to a bridge mode speaker.

13. Apparatus for obtaining off-line direct audio directly from a power supply comprising:

a terminal for receiving an audio input signal;

a power supply voltage having sufficient voltage to drive an audio output speaker;

a full-wave rectifier for rectifying said audio input signal;

a modulator for modulating said rectified audio input signal;

a power amplification stage including a switching power transformer for increasing the power of said modulated audio signal;

a filter circuit for recovering said modulated audio signal coupled to an output winding of said switching power transformer for providing a voltage sufficient to drive said audio output speaker; and a first and second gates having outputs commonly coupled to the input winding of said switching power transformer for transferring said modulated rectified audio output signal to said filter circuit.

14. The apparatus of claim 13 wherein said modulator is a pulse-width modulator.

15. The apparatus of claim 13 wherein said modulator is a frequency modulator.

16. The apparatus of claim 13 wherein said modulator is a phase modulator.

17. The apparatus of claim 13 wherein said switching power transformer comprises:

a power transformer having a voltage input winding and a voltage output winding;

first and second ends on said voltage input winding;

first and second ends and a center tap on said voltage output winding;

a first switch coupled to said voltage output winding of said power transformer for coupling only positive voltages from said power transformer to said filter circuit; and a second switch coupled to said voltage output winding of said power transformer for coupling only negative voltages to said filter circuit.

18. The apparatus of claim 17 further including:

first and second diodes coupled between said first end of said voltage output winding and said first and second switches, respectively;

said first diode being connected to said first switch and said second diode being connected to said second switch in opposite polarity to said first switch;

third and fourth diodes coupled between said second end of said voltage output winding and said first and second switches, respectively;

said third diode being connected to said first switch in parallel with said first diode and said fourth diode being connected to said second switch in parallel with said second diode; and the center tap of said transformer being coupled to said filter circuit.

19. The apparatus of claim 13 further including a phase-lag compensation circuit being coupled to said filter circuit for preventing oscillation of said apparatus.

20. a method of amplifying an input audio signal, comprising:

rectifying said input audio signal;

generating a pulse width modulated signal from said rectified audio signal;

power amplifying said pulse width modulated signal;

positive rectifying said amplified pulse width modulated signal only when said input audio signal is a first polarity;

negative rectifying said amplified pulse width modulated signal only when a polarity of said input audio signal is a second polarity; and demodulating said positively and negatively amplified rectified pulse width modulated signal to generate first a power amplified input audio signal.

21. The method of claim 20, further including a step of detecting the polarity of said input audio signal.

22. The method of claim 20, wherein said power amplifying step comprises the steps:

providing a switching power transformer having an input winding and an output winding; and using a pair of transistors in a push-pull configuration to couple a power supply voltage to said switching transformer to generate positive and negative currents through said input winding of said switching transistor in response to said pulse width modulated signal.

23. The method of claim 22, wherein said switching transformer is a voltage step-up transformer.

24. The method of claim 20, wherein said power amplifying step comprises the steps:

providing a switching power transformer having an input winding and an output winding;

using a first pair of transistors in a push-pull configuration to couple a positive power supply voltage to said switching transformer to generate a positive current through said input winding of said switching transformer in response to a first polarity of said pulse width modulated signal; and using a second pair of transistors in a push-pull configuration to couple a negative power supply voltage to said switching transformer to generate a negative current through said input winding of said switching transformer in response to a second polarity of said pulse width modulated signal.

25. The method of claim 24, further including a step of providing an isolation transformer having an input winding for receiving said pulse width modulated signal and output windings coupled respectively to said first and second pairs of transistors for causing their push-pull operations.

26. The method of claim 20, further including the steps of:

negative rectifying said amplified pulse width modulated signal to form a second negatively rectified amplified pulse modulated signal when a polarity of said input audio signal is positive;

positive rectifying said amplified pulse width modulated signal to form a second negatively rectified amplified pulse modulated signal when a polarity of said input audio signal is negative; and demodulating said second positively and second negatively amplified rectified pulse width modulated signals to generate a second power amplified input audio signal.

27. The method of claim 26, further including the steps of:

using said first power amplified audio signal to drive a first speaker; and using said second power amplified audio signal to drive a second speaker.

28. The method of claim 27, further including a step of:

using said first and second amplified audio signals to drive a third speaker.

29. An audio amplifier for amplifying an input audio signal, comprising:

an input rectifier for rectifying said input audio signal;

a modulator for generating a pulse width modulated signal from said rectified audio signal;

a power amplification stage for amplifying said pulse width modulated signal;

a signal polarity detector for detecting a polarity of said input audio signal;

a positive rectifier for positively rectifying said amplified pulse width modulated signal in response to said signal polarity detector sensing a first polarity of said input audio signal;

a negative rectifier for negatively rectifying said amplified pulse width modulated signal in response to said signal polarity detector sensing a second polarity of said input audio signal; and first a demodulator for demodulating said positively and negatively amplified rectified pulse width modulated signals to generate a power amplified audio signal therefrom.

30. The audio amplifier of claim 29, wherein said power amplification stage comprises:

a switching power transformer having an input winding and an output winding; and a pair of transistors in a push-pull configuration for coupling a power supply voltage to said switching transformer to generate positive and negative currents through said input winding of said switching transformer in response to said pulse width modulated signal.

31. The audio amplifier of claim 30, wherein said input winding of said switching transformer includes an intermediate tap for receiving said power supply voltage.

32. The audio amplifier of claim 30, wherein one of said pair of transistors is configured for coupling a positive power supply voltage to said input winding of said switching transformer to generate said positive current, and wherein another of said pair of transistors is configured for coupling a negative power supply voltage to said input winding of said switching transformer to generate said negative current.

33. The audio amplifier of claim 29, wherein said power amplification stage comprises:

a switching power transformer having an input winding and an output winding;

a first pair of transistors in a push-pull configuration to couple a positive power supply voltage to said switching transformer to generate a positive current through said input winding of said switching transformer in response to a first polarity of said pulse width modulated signal; and a second pair of transistors in a push-pull configuration to couple a negative power supply voltage to said switching transformer to generated a negative current through said input winding of said switching transformer in response to a second polarity of said pulse width modulated signal.

34. The audio amplifier of claim 33, further comprising an isolation transformer having an input winding for receiving said pulse width modulated signal and output windings coupled respectively to said first and second pairs of transistors for causing their push-pull operations.

35. The audio amplifier of claim 29, further including:

a second negative rectifier for rectifying said amplified pulse width modulated signal to form a second negatively rectified amplified pulse modulated signal in response to said signal polarity detector sensing a positive polarity of said input audio signal;

a second positive rectifier for rectifying said amplified pulse width modulated signal to form a second positively rectified amplified pulse modulated signal in response to said signal polarity detector sensing a negative polarity of said input audio signal; and a second demodulator for demodulating said second positively and second negatively amplified rectified pulse width modulated signals to generate a second power amplified input audio signal.

36. The audio amplifier of claim 35, further including:

a first speaker coupled to said first demodulator; and a second speaker coupled to said second demodulator.

37. The audio amplifier of claim 36, further including:

a third speaker coupled to said first and second demodulators.

38. An audio amplifier for amplifying an input audio signal, comprising:

an input rectifier for rectifying said input audio signal;

a modulator for generating a pulse width modulated signal from said rectified audio signal;

a power amplification stage for amplifying said pulse width modulated signal;

a signal polarity detector for detecting a polarity of said input audio signal;

a positive rectifier for positively rectifying said amplified pulse width modulated signal;

a negative rectifier for negatively rectifying said amplified pulse width modulated signal;

a demodulator for demodulating said positively and negatively amplified pulse width modulated signals to generate a power amplified audio signal therefrom; and a switching network for directing said positively amplified pulse modulated signal to said demodulator in response to said signal polarity detector sensing a first polarity of said input audio signal, and for directing said negatively amplified pulse modulated signal to said demodulator in response to said signal polarity detector sensing a second polarity of said input audio signal.

* * * * *